(12) United States Patent
Connor et al.

(10) Patent No.: US 8,323,744 B2
(45) Date of Patent: Dec. 4, 2012

(54) SYSTEMS, METHODS, DEVICES AND ARRANGEMENTS FOR NANOWIRE MESHES

(75) Inventors: Steve T. Connor, Stanford, CA (US); Jung-Yong Lee, Menlo Park, CA (US); Yi Cui, Sunnyvale, CA (US); Peter Peumans, Sunnyvale, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 655 days.

(21) Appl. No.: 12/351,313

(22) Filed: Jan. 9, 2009

(65) Prior Publication Data

US 2010/0178417 A1    Jul. 15, 2010

(51) Int. Cl.
   *B05D 5/12* (2006.01)
   *B05D 3/02* (2006.01)

(52) U.S. Cl. ....... 427/383.1; 427/77; 427/369; 977/890; 977/948

(58) Field of Classification Search .............. 427/74, 427/383.1, 369; 977/890, 948
   See application file for complete search history.

(56) References Cited

U.S. PATENT DOCUMENTS

| | | | |
|---|---|---|---|
| 6,914,372 B1 * | 7/2005 | Akiyama et al. | 313/309 |
| 2007/0074316 A1 | 3/2007 | Alden et al. | |
| 2008/0143906 A1 | 6/2008 | Allemand et al. | |

FOREIGN PATENT DOCUMENTS

| | | |
|---|---|---|
| WO | WO 2007/022226 | 2/2007 |
| WO | WO 2008/046058 | 4/2008 |
| WO | WO 2008/073143 | 6/2008 |
| WO | WO 2008-127313 | * 10/2008 |

OTHER PUBLICATIONS

M. Silva, C. da Silva, F. Fogo, E. Pineda and A. Heckenleitner, "*Thermal and FTIR Study of Polyvinylpyrrolidone/Lignin Blends*," Journal of Thermal Analysis and Calorimetry, vol. 79, pp. 367-370 (2005) (first page only).

P. Andrew and A.Ilie, "*Functionalised Silver Nanowire Structures*," Journal of Physics: Conf. Series 61, pp. 36-40, (2007).

J. Lee, S. Connor, Y. Cui and P. Peumans, "*Solution-Processed Metal Nanowire Mesh Transparent Electrodes*," Nano Letters, vol. 8, No. 2, pp. 689-692 (2008).

S. Hellstrom, H. Lee and Z. Bao, "*Polymer Assisted Direct Deposition of Uniform Carbon Nanotube Bundle Networks for High Performance Transparent Electrodes*," ACS Nano, 3 (6), pp. 1423-1430 (2009).

J. Westwater, D.P. Gosain, S. Tomiya, S. Usui and H. Ruda, "*Growth of silicon nanowires via gold/silane vapor-liquid-solid reaction*," J. Vac. Sci. Technol. B 15(3), pp. 554-557 (May/Jun. 1997).

(Continued)

*Primary Examiner* — James Lin
(74) *Attorney, Agent, or Firm* — Crawford Maunu PLLC

(57) ABSTRACT

A variety of methods, devices, systems and arrangements are implemented involving nanowire meshes. One such method is implemented to include synthesizing metal nanowires in a solution containing a structure-directing agent. The metal nanowires are deposited on a substrate to form a sheet of nanowires. The deposited metal nanowires are heated to a temperature less than about 200 degrees Celsius and for a period of time of about 10 minutes to 60 minutes, thereby removing the structure-directing agent and modifying the electrical conductivity and optical transmittance of the sheet of nanowires.

10 Claims, 6 Drawing Sheets

OTHER PUBLICATIONS

J. Graetz, C.C. Ahn, R. Yazami and B. Fultz, "*Highly Reversible Lithium Storage in Nanostructured Silicon*," Electrochemical and Solid-State Letters, 6 (9), pp. A194-A197 (2003).

K. Dick, K. Deppert, L. Karlsson, L. Wallenberg, L. Samuelson and W. Seifert, "*A New Understanding of Au-Assisted Growth of III-V Semiconductor Nanowires*," Adv. Funct. Mater. 15, pp. 1603-1610 (2005).

J.B. Hannon, S. Kodambaka, F.M. Ross and R.M. Tromp, "*The influence of the surface migration of gold on the growth of silicon nanowires*," Nature Letters, vol. 440|2, pp. 69-71 (Mar. 2006).

U. Kasavajjula, C. Wang, and A.J. Appleby, "*Nano- and bulk-silicon-based insertion anodes for lithium-ion secondary cells*," ScienceDirect, Journal of Power Sources, 163, pp. 1003-1039 (2007).

\* cited by examiner

US 8,323,744 B2

SYSTEMS, METHODS, DEVICES AND ARRANGEMENTS FOR NANOWIRE MESHES

FEDERALLY-SPONSORED RESEARCH AND DEVELOPMENT

This invention was made with Government support under contract 0507301 awarded by the National Science Foundation. The Government has certain rights in this invention.

FIELD OF THE INVENTION

The present invention relates generally to conductive and transparent electrodes, and more particularly to such electrodes implemented using a metal nanowire mesh.

BACKGROUND

Thin-film optoelectronic devices make use of transparent, conductive thin-film electrodes to provide a low-resistance electrical contact to the active layers while not impeding coupling of light into and out of the devices. Transparent, conductive metal oxides such as indium tin oxide (ITO) and Al-doped zinc oxide are commonly used for this purpose, but they have a number of disadvantages. The cost of sputtered metal oxide thin films may be too high for applications, such as roll-to-roll processed solar cells and large-area organic light-emitting diodes (LEDs) for lighting applications. When deposited on flexible substrates, the brittleness of metal oxides leads to film cracking when the substrate is bent, causing device failure. In cases where a transparent electrode is required on top of organic active layers, the sputter deposition of ITO onto an organic material is known to cause damage to the underlying organic layers, which leads to a decrease in device performance. Finally, there is a tradeoff between optical transparency and sheet resistance: thicker films (or higher doping concentrations) decrease not only the film sheet resistance but also the optical transparency, especially for low sheet resistances.

SUMMARY

Aspects of the present invention are directed to electrode applications that address challenges including those discussed above, and that are applicable to a variety of transparent-conductor applications, devices, systems and methods. These and other aspects of the present invention are exemplified in a number of implementations and applications, some of which are shown in the figures and characterized in the claims section that follows.

According to one embodiment of the present invention, a method is implemented that includes synthesizing metal nanowires in a solution containing a structure-directing agent. The metal nanowires are deposited on a substrate to form a sheet of nanowires. The deposited metal nanowires are heated to a temperature less than about 200 degrees Celsius and for a period of time of about 10 minutes to 60 minutes, thereby removing the structure-directing agent and modifying the electrical conductivity and optical transmittance of the sheet of nanowires.

According to another embodiment of the present invention, a method is implemented that includes synthesizing metal nanowires in a solution containing a structure-directing agent. The metal nanowires are deposited on a substrate to form a sheet of nanowires. The structure-directing agent is removed using a removal profile that results in sheet conductivity of less than about 25 ohms per square and sheet transmittance of at least 80 percent for all wavelengths between 400 nanometers and 800 nanometers. According to one removal profile, the deposited metal nanowires are heated to a temperature less than about 200 degrees Celsius and for a period of time of about 10 minutes to 60 minutes. According to a second removal profile, the deposited metal nanowires are heated to a temperature less than about 240 degrees Celsius and for a period of time of about 10 minutes to 50 minutes. According to another removal profile, the deposited nanowires are coated or replaced with a second metal. In one instance, the nanowires are Silver and the second metal is Gold.

Embodiments of the present invention relate to a device that includes a nanowire mesh. The nanowire mesh has the properties of sheet conductivity of less than about 25 ohms per square and sheet transmittance of at least 80 percent for all wavelengths between 400 nanometers and 800 nanometers.

An embodiment of the present invention relates to optical circuits that receive and/or transmit light passing through a nanowire mesh that has the properties of sheet conductivity of less than about 25 ohms per square and sheet transmittance of at least 80 percent for all wavelengths between 400 nanometers and 800 nanometers.

Other embodiments relate to organic-based circuits upon which a metallic-nanowire mesh is deposited. The nanowire mesh can have the properties of sheet conductivity of less than about 25 ohms per square and sheet transmittance of at least 80 percent for all wavelengths between 400 nanometers and 800 nanometers.

The above summary is not intended to describe each illustrated embodiment or every implementation of the present invention.

BRIEF DESCRIPTION OF THE DRAWINGS

The invention may be more completely understood in consideration of the following detailed description of various embodiments of the invention in connection with the accompanying drawings, in which.

Figure 1:
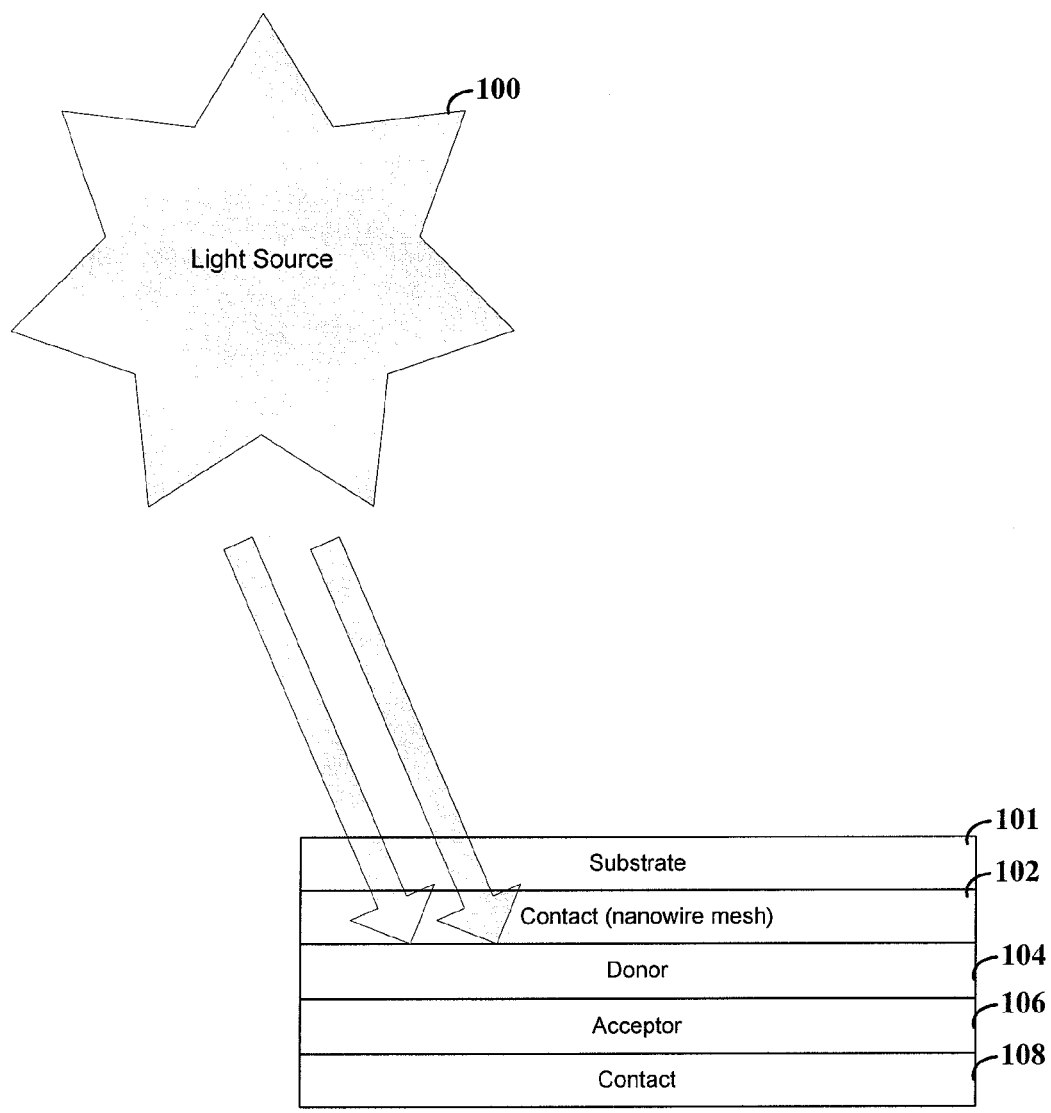
FIG. 1 shows an example implementation of an organic photovoltaic-cell, consistent with an embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

The present invention is directed to transparent electrodes and related approaches, their uses and systems for the same. These and other aspects of the present invention are exemplified in a number of illustrated implementations and applications, some of which are shown and characterized in the following description and related figures, and further in the claims section that follows.

Aspects of the present invention relate to methods for generating a nanowire mesh that has favorable characteristics of electrical conductivity and optical transmittance. According to one such method, nanowire suspensions are created with the help of a structure-directing agent. The nanowires are deposited on a substrate. A removal profile is followed that results in the removal of a structure-directing agent from the deposited nanowire.

Aspects of the present invention are particularly useful for applications that involve covering large areas with one or more transparent/translucent electrodes including the control of costs associated with preparation and application of the nanowires. Implementations of the nanowire meshes are also particularly useful for flexible substrate applications.

In certain implementations, the large-scale production of nanowire suspensions allows for the use of the nanowire suspensions in a variety of different applications/devices, thereby allowing for flexibility in the manufacturing process. In this manner some of the nanowires from the large-scale production can be used in the manner describe herein (e.g., to produce transparent and conductive electrodes), while others of the nanowires can be used in a variety of other products and manners.

In one implementation, the nanowire suspension is produced by reducing a compound (e.g., Ag nitrate) in the presence of a structure-directing agent (e.g., polyvinlypyrrolidone (PVP)). The resulting nanowires can be deposited on a suitable substrate to create a conductive nanowire-mesh. In some instances the presence of the structure-directing agent is undesirable. For example, the structure-directing agent can have an adverse effect on the electrical conductivity and/or the optical transmittance. In such instances the structure-directing agent can be removed using a removal profile. The removal profile can be selected so as to achieve the desired properties for the resulting nanowire mesh. Aspects of the present invention relate to specific removal profiles that can result in significant improvements in the properties of the conductive nanowire-mesh.

According to one embodiment, the structure-directing agent is removed by annealing the nanowire mesh. According to another embodiment, the structure-directing agent is removed by applying a metal coating to the nanowire mesh, thereby replacing the structure-directing agent. Each of these removal steps can be implemented using a carefully selected removal profile. The removal profile can be selected to increase both the conductivity and the optical transmittance of the metal nanowire-mesh.

Studies have shown that decomposition of PVP begins at around 250 degrees (Celsius). Surprisingly, a (PVP) removal profile has been discovered that operates at temperatures lower than 250 degrees. This removal profile can improve both the conductivity and the optical transmittance of a metal nanowire mesh because excessive heating (temperature and/or time) can cause the nanowires to effectively melt-down (away) from contact points and thereby cause an increase in sheet resistance. Thus, a removal profile that uses this lower temperature can help maintain interconnections between nanowires while still removing a sufficient amount of the PVP material.

Embodiments of the present invention allow for use of annealing temperatures of less than 250 degrees. In certain implementations the annealing temperature can be implemented at less than 240 degrees and more than 170 degrees. More specific implementations involve the use of annealing temperatures of between about 180 degrees and 200 degrees.

Aspects of the present invention relate to properties of a metallic nanowire mesh which can be used in connection with a number of different applications including, but not limited to, applications discussed herein and shown in the various figures. These properties can include one or more of the following, but are not necessarily limited thereto, nanowire size, nanowire composition, sheet conductance, optical transmittance, nanowire-to-nanowire conductance, and flexibility. A particular implementation includes Ag nanowires that are 8.7 (+/−3.7) µm long and have a diameter of 103 (+/−17) nm. Sheet resistances of between 100 Ω/square and 10 Ω/square can be obtained using proper removal profiles. Optical transmittance of between 80% and 90% can be obtained for wavelengths between 400 nm and 800 nm. Significant flexibility can also be realized, e.g., less than 1% change in sheet resistance for bending radii down to 4 mm, and no changes after such bending is ceased. Aspects of the invention allow for selection of a removal profile so as to achieve these and other desired properties.

An embodiment of the present invention is directed toward the use of pressure to smooth the nanowire mesh. In some applications, the resulting nanowire meshes/films are too rough for use. For instance, the roughness of the nanowire meshes can be problematic for organic solar cells with active layer thicknesses in the range of 50-200 nm. The amount of pressure and duration can be selected depending upon the desired effect and application. In an example implementation, to lower the surface roughness, the NW meshes are subjected to uni-axial pressure of about 1.4(+/−0.6)×10e4 pounds per square inch. The pressure can be applied via a clean (glass) substrate for about 30 seconds. This has been shown to provide substantial flattening of the features. Such an application of pressure to the nanowire mesh can also be useful for improving interconnection between overlapping nanowires.

FIG. 1 shows an example implementation of an organic photovoltaic-cell, consistent with an embodiment of the present invention. Light source 100 provides optical stimulus to the photovoltaic cell. This light passes through substrate 101 (e.g., glass, polyethylene terephthalate, plastic, or other translucent material) and contact 102, which is implemented using a metallic nanowire mesh, and interacts with donor layer 104 and acceptor layer 106. The interaction generates electrical charges that are collected at contact 102 and contact 108.

Figure 2:
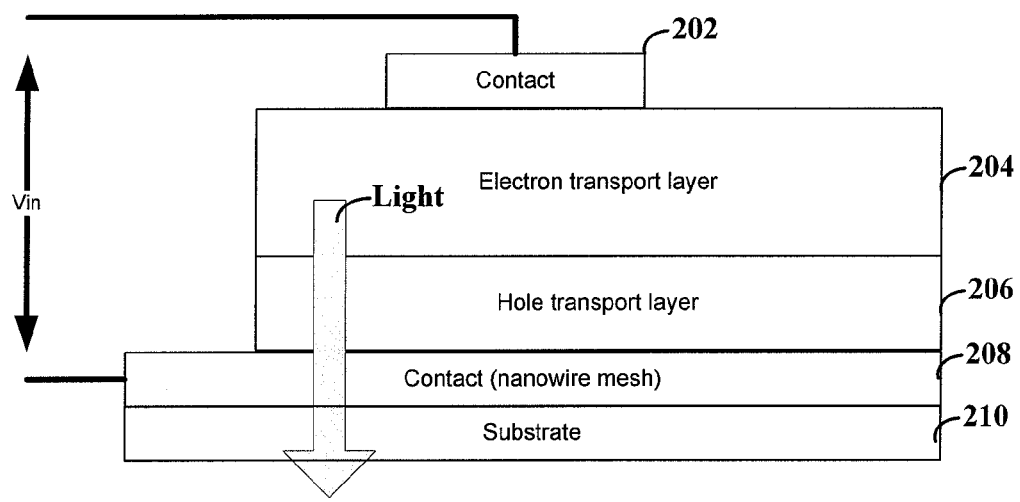
FIG. 2 shows an example implementation of an organic light-emitting-diode (LED), consistent with an embodiment of the present invention.

FIG. 2 shows an example implementation of an organic light-emitting-diode (LED), consistent with an embodiment of the present invention. The LED is controlled by applying a voltage (Vin) across contacts 202 and 208. This voltage is passed from contacts 202 and 208 to electron transport layer 204 and hole transport layer 206 resulting in the release of photons/light. This light passes through substrate 210 and contact 208, which is implemented using a metallic nanowire mesh consistent with aspects of the present invention.

Generally, contact 102, 208 should have both a high conductivity and a high optical transmittance to provide the best efficiency. Although organic LEDs/photovoltaic-cells are generally considered cheap and easy to manufacture, when compared to many nonorganic photovoltaic-cells, their efficiency is often poor. Thus, the nanowire meshes of the present invention can be particularly useful for organic optical circuits. The photovoltaic cell, however, need not be organic as properties of the nanowire mesh can be useful in other types of (e.g., silicon-based) photovoltaic-cells.

Figure 3:
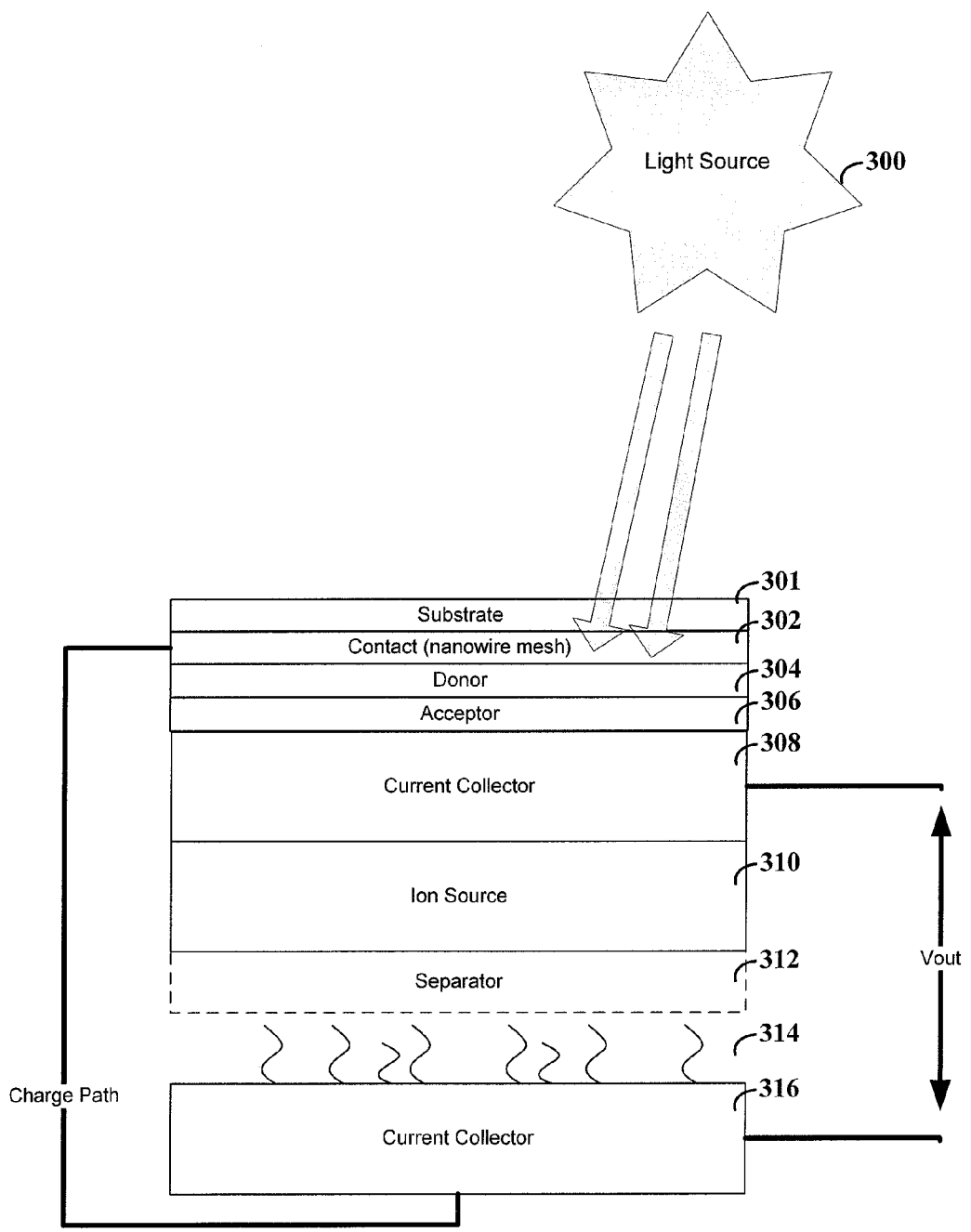
FIG. 3 shows an example implementation that combines a photovoltaic cell and battery, consistent with an embodiment of the present invention.

FIG. 3 shows an example implementation that combines a photovoltaic cell and battery, consistent with an embodiment of the present invention. Light source 300 provides optical energy to donor layer 304 after passing through substrate 301 and contact 302, which is implemented using a metallic nanowire mesh. Acceptor layer 306 and donor layer 304 generate electrical charges that are collected at contact 302 and current collector (contact) 308. Contact 308 also serves as a contact for the battery portion of the circuit. This use of the same contact can be particularly useful for reducing additional costs associated with the photovoltaic portion of the cell; however, a separate and distinct contact can also be used for each of the battery and photovoltaic portions of the circuit. The battery portion of the circuit also includes an ion source 310 (optionally), separator 312 and (optionally) nanowires 314 and current collector 316 which is part of the anode of the battery portion. The nanowires interact with ions from ion source 310. Ion source 310 may include a material that contains Lithium, such as $LiCoO_2$. The battery portion provides an output (Vout) that can be used to provide electrical power to a circuit. Power generated by the photovoltaic portion of the circuit is transmitted along the charge path to charge the battery portion. The nanowire meshes of the present invention are adaptable for alternative applications including, but not limited to, different types of batteries, power supplies and circuits.

The use of organic photovoltaic cells in this manner can be particularly useful for extending the charge life of the battery without an additional/external photovoltaic panel. For instance, the photovoltaic cells can be applied to the exterior of the battery in a manner that conforms to the desired shape and/or form factor.

The circuits depicted in FIGS. 1-3 are not limiting and are merely examples of circuits that can benefit from the use of a metallic nanowire mesh consistent with aspects of the present invention. For instance, non-organic LED and photovoltaic cells can also benefit from aspects of the present invention. There are numerous other optical circuits that can use metallic nanowire mesh having one or more of the properties discussed herein. In one such instance, optical displays can benefit from use of such nanowire meshes. Due to the relatively high optical transmittance of the nanowire meshes, electrical routing can be implemented in areas where low optical transmittance would adversely affect the optical display properties. This can be particularly useful for applications in which electrical routing is at a premium, as is sometimes the case with densely-packed electronics found in more and more electronic devices. Televisions, cellular phones, hand-held devices represent a few examples of such electronic devices.

In other implementations, the metallic nanowire mesh can be used in circuits that are not optically-based. An advantage of some organic (LEDs/photovoltaic cells) circuits is their flexibility, and thus, a high-level of flexibility for contact 102 can be advantageous for such applications. Yet another use of the nanowire meshes relates to the providing of a conductive coating on an otherwise transparent or translucent object. In this manner an otherwise nonconductive surface can function as a conductive surface without sacrificing the optical properties.

Consistent with various embodiments of the present invention, a number of experiments were carried out. These experiments served a number of purposes including, but not limited to, determination of the properties of metallic nanowire meshes and the effect of different removal profiles on these properties.

Figure 4:
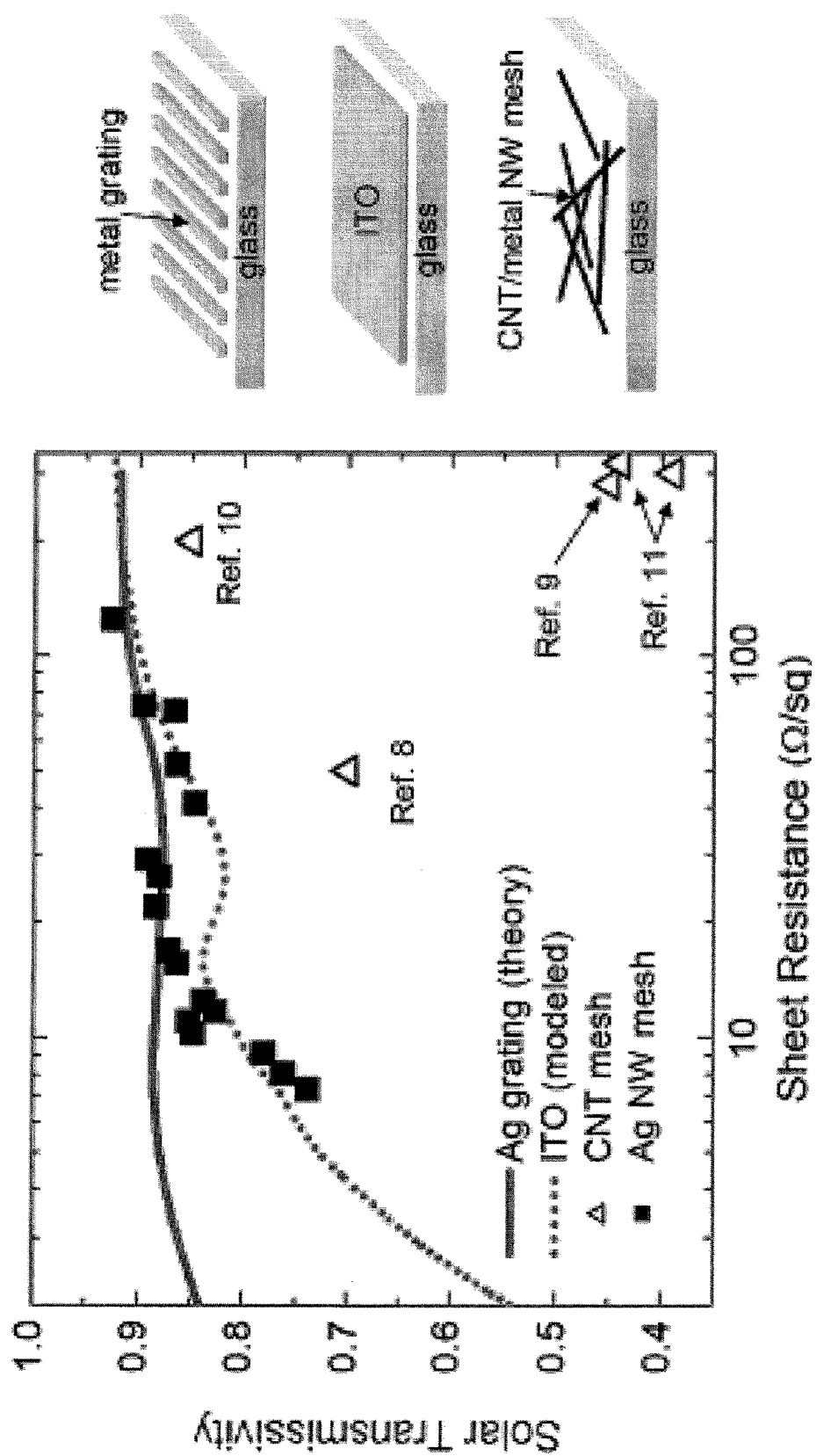
FIG. 4 shows results for solar photon flux-weighted transmissivity versus sheet resistance for a variety of different implementations, consistent with an embodiment of the present invention.

FIG. 4 shows results for solar photon flux-weighted transmissivity versus sheet resistance for a variety of different implementations. In particular, FIG. 4 shows these results for Ag gratings (solid line), indium tin oxide (ITO) (dotted line), carbon nanotube (CNT) meshes (open triangle) and Ag nanowire (solid square) meshes, each deposited on a glass substrate. Finite-element modeling was used to obtain the data for the Ag gratings according to the following parameters. The grating period was 400 nm, the Ag line width is 40 nm, and the thickness was varied. The data for ITO were computed based on optical constants for e-beam deposited ITO acquired using spectroscopic ellipsometry. The data for CNT meshes were obtained from the literature, and the Ag nanowire mesh data were obtained experimentally. $T_{Solar}$ was calculated by integrating the product of the spectrally resolved transmittance with the spectrally resolved AM1.5 photon flux over the wavelength range $\lambda=400$-$800$ nm.

Figure 5:
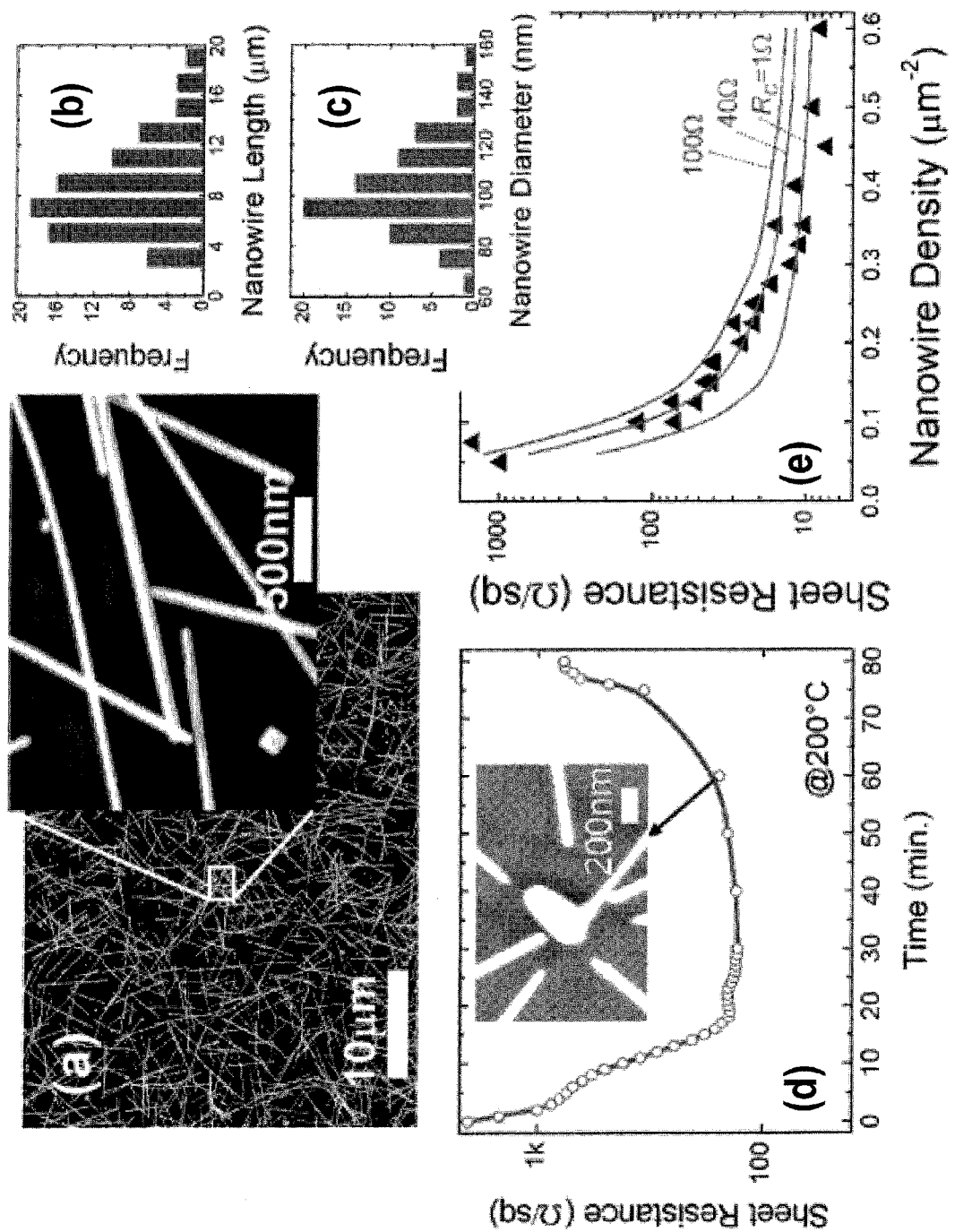
FIG. 5A shows scanning electron microscope (SEM) images of an Ag nanowire mesh on a silicon substrate, consistent with an embodiment of the present invention.
FIG. 5B shows the Ag nanowire length histogram, consistent with an embodiment of the present invention.
FIG. 5C shows the Ag nanowire diameter histogram, consistent with an embodiment of the present invention.
FIG. 5D shows sheet resistance vs annealing time for an Ag nanowire mesh annealed at 200 degrees (Celsius), consistent with an embodiment of the present invention.
FIG. 5E shows experimentally determined sheet resistance vs Ag nanowire aerial density, consistent with an embodiment of the present invention.

FIG. 5A shows scanning electron microscope (SEM) images of an Ag nanowire mesh on a silicon substrate, consistent with an embodiment of the present invention. FIG. 5B shows the Ag nanowire length histogram, and FIG. 5C shows the Ag nanowire diameter histogram. FIG. 5D shows sheet resistance vs annealing time for an Ag nanowire mesh annealed at 200 degrees. After approximately 40 min of annealing, the Ag nanowires start to coalesce, breaking the electrical connections, as shown in the SEM image in the inset. The arrow indicates a nanowire exhibiting a broken connection. FIG. 5E shows experimentally determined sheet resistance vs Ag nanowire aerial density (triangles) and theoretical results for a nanowire length of 8.7 μm and diameter of 103 nm (wire resistance $(R_W)=18\Omega$) and for the following values of contact resistances $(R_C)$: $1\Omega$, $40\Omega$, and $100\Omega$ (solid lines).

Figure 6:
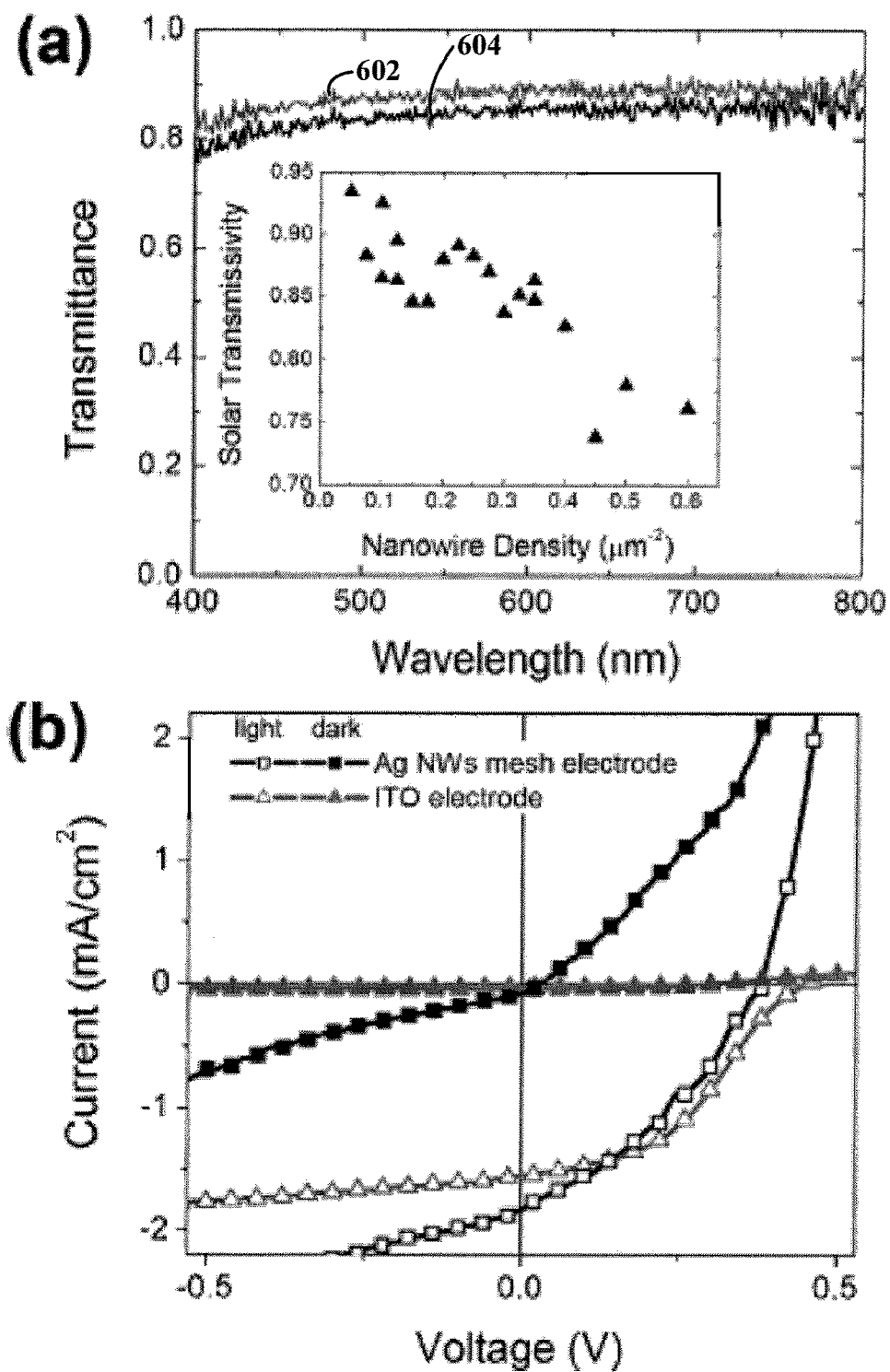
FIG. 6A shows diffuse optical transmittance for two Ag nanowire meshes, consistent with an embodiment of the present invention.
FIG. 6B shows current density vs voltage for organic photovoltaic cells, consistent with an embodiment of the present invention.

FIG. 6A shows diffuse optical transmittance for two Ag nanowire meshes with $R_{sh}=10.3$ Ω/sq (604—lower line) and $R_{sh}=22.1$ Ω/sq (602—upper line). The solar photon flux-weighted transmissivity of these two films is $T_{Solar}=84.7\%$ and $T_{Solar}=88.3\%$, respectively. The inset shows solar photon flux-weighted transmissivity as a function of Ag nanowire mesh aerial density (triangles).

FIG. 6B shows current density vs voltage for organic photovoltaic cells with device structure 45 nm CuPc/45 nm PTCBI/10 nm BCP/100 nm Ag on an Ag nanowire mesh (squares) and ITO (triangles) in the dark (filled symbols) and under 65 mW/cm2 AM1.5 illumination (open symbols).

According to a specific implementation, Ag nanowires were synthesized by the reduction of Ag nitrate in the presence of polyvinylpyrrolidone (PVP) in ethylene glycol. The resulting Ag nanowires were 8.7 (+/−3.7) μm long and had a diameter of 103 (+/−17) nm. To fabricate transparent electrodes using nanowire suspensions, a volume of the nanowire suspension was dropped on a glass substrate with 100-nm-thick pre-patterned Ag contact pads and allowed to dry in the air for 10 min while agitated on a shaker. The resulting films were random meshes of Ag nanowires without significant bundling of wires that were uniform over the area of the substrate, as shown in the SEM images in FIG. 5A. The initial sheet resistance of the nanowire mesh electrodes was greater than 1 k Ω/sq due, in part, to the presence of the 1-nm- to 3-nm-thick PVP surfactant layer. As shown in FIG. 5B, annealing of the meshes at a temperature of 200 degrees (Celsius) results in a steep drop of the sheet resistance ($R_{sh}$) (measured at the annealing temperature) by more than an order of magnitude from $R_{sh}$>1 k Ω/sq to $R_{sh}$>100 Ω/sq after 20 minutes. This reduction in $R_{sh}$ can be attributed to the flowing and partial decomposition of the PVP which allows the Ag nanowires to make (direct) contact and fuse together. Continued annealing at 200 degrees for more than 40 min led to a gradual increase in $R_{sh}$ as the Ag nanowires coalesce into disconnected droplets. The low $R_{sh}$ was achieved for temperatures as low as 180 degrees.

The $R_{sh}$ of a metal nanowire mesh depends on the wire length, L, wire resistance, $R_W$, the wire-wire contact resistance, $R_C$, and wire aerial density, D. To understand the factors that limit $R_{sh}$, dependencies on these parameters were evaluated. Computer generated random meshes were used in the evaluation. The distribution of Ag nanowire lengths and diameters was determined from SEM images as shown in FIG. 5A. The average length ($L_{avg}$) was 8.7 μm, and the average diameter ($d_{avg}$) was 103 nm. Assuming the bulk resistivity of Ag is ρ=1.6 μΩ·cm, the average wire was determined to have a resistance of $R_{W,avg}$=18Ω. In the simulated nanowire meshes, all wires were assumed to be of length L=$L_{avg}$ with a wire resistance of $R_W$=$R_{W,avg}$. In FIG. 5C, the experimentally obtained $R_{sh}$ for Ag nanowire meshes with varying wire density, D, determined from SEM images, is compared with model calculations assuming $R_C$=1 Ω, 40Ω, and 100Ω. The data agreed well with the model calculations for $R_C$=40Ω for D<0.3 μm$^{-2}$. For D>0.3 μm$^{-2}$, the data was better described by model calculations for $R_C$=1Ω. Without being bounded by theory, this was attributed to the formation of many parallel connections with the lowest resistance connections dominating the overall resistance.

An Ag nanowire mesh with $R_{sh}$=11.8 Ω/sq was deposited on 63.5-μm-thick Kapton tape to evaluate changes in $R_{sh}$ when the substrate is bent. No changes in $R_{sh}$ larger than 1% were measured for bending radii down to 4 mm, and no changes were observed when the substrate relaxed back to the planar shape.

The random nature of the Ag nanowire meshes lead to substantial scattering of incident light. Approximately 20% of the transmitted light was scattered over angles >10 degrees. Since the scattered light contributes to photocurrent generation in solar cells, the optical transmittance of the Ag nanowire meshes was measured using an integrating sphere. The spectrally resolved diffuse transmittance for two Ag nanowire meshes is shown in FIG. 6A. The solar photon flux-weighted transmissivity, $T_{Solar}$, is plotted as a function of the nanowire mesh aerial density in the inset of FIG. 6A (triangles) and as a function of its $R_{sh}$ in FIG. 6B (squares). For a given $R_{sh}$, the Ag nanowire meshes on glass exhibit a $T_{Solar}$ that is comparable to or higher than that of ITO on glass. Given that the Ag nanowire meshes can potentially be deposited at much lower cost (e.g., because they can be processed from solution, and as they can be prepared using only a moderate temperature step of 180-200 degrees, and do not fail upon bending of the substrate, they can be a particularly attractive replacement for metal-oxide transparent electrodes.

To evaluate the potential of metal nanowire mesh transparent electrodes for use in devices, small molecular weight organic photovoltaic cells were deposited onto Ag nanowire mesh electrodes with $T_{Solar}$=86% and $R_{sh}$=16 Ω/sq. The Ag nanowire mesh was coated with a layer of poly(ethylenedioxythiophene) poly(styrenesulfonate) (PEDOT:PSS) by spin-coating after annealing to adjust the work-function. The presence of the transparent, conductive PEDOT:PSS layer ensures that holes generated in the organic solar cell are collected efficiently despite the relatively large distance between the Ag nanowires compared to the thickness of the organic layers. On top of the Ag nanowire-PEDOT: PSS composite transparent electrode, a bilayer solar cell with the following layer structure was deposited by vacuum sublimation: 45 nm of copper phthalocyanine (CuPc)/45 nm of perylenetetracarboxylix bisbenzimidazole (PTCBI)/10 nm of bathocuproine (BCP)/100 nm of Ag. The same device structure was simultaneously deposited on an ITO transparent electrode on glass for comparison. The thickness of these devices is larger than the optimal thickness in order to prevent shorts due to the topography of the 100-nm-diameter Ag nanowire meshes.

In FIG. 6B, the current-voltage characteristics of the bilayer photovoltaic devices in the dark and under 65 mW/cm$^2$ AM1.5 illumination are shown. The short circuit current density, $J_{SC}$, was 1.83 mA/cm$^2$ for the devices deposited on the Ag nanowire mesh electrode and 1.54 mA/cm$^2$ for devices on ITO. While not bounded by theory, the 19% increase in short circuit current for the devices on the Ag nanowire mesh can be attributed to the higher optical transmissivity, improved optical path length due to scattering of incident light, increased roughness of the donor-acceptor interface, and/or a local enhancement of the optical intensity near the metal nanowires. The power conversion efficiencies of the devices on the random Ag nanowire mesh and ITO electrode were 0.38% and 0.42%, respectively. The lower efficiency of the device on the Ag nanowire mesh was chiefly due to a higher dark current that may be the result of current shunt paths due to the roughness of the Ag nanowire electrode. The efficiency of these devices can likely be improved for this material system because thick, non-optimized devices were used.

For further details on experimental results and applications therefrom, reference can be made to *Solution-Processed Metal Nanowire Mesh Transparent Electrodes*, Jung-Yong Lee et al., NANO LETTERS (2008) Vol. 8, No. 2, 689-692, which is fully incorporated herein by reference.

According to another embodiment, a removal profile was implemented in which the removal of the structure-directing agent (e.g., PVP) was implemented by applying a metallic coating to the deposited nanowires of the nanowire mesh.

A specific, experimental, implementation of such an embodiment (and corresponding results) involves immersion of the NW mesh (on glass) into an ethanolic or aqueous solution of gold salt (HAuCl4) at temperatures between 25 degrees and 100 degrees (Celsius) for 1-10 minutes. A partial to total replacement of Ag with Au occurs. The ratio of Ag and Au can be controlled by modifying the process time. At short times, a thin shell of Au is formed on the AgNW mesh, while at longer times, Au nanotubes are formed.

The various embodiments described above are provided by way of illustration only and should not be construed to limit the invention. Based upon the above discussion and illustrations, those skilled in the art will readily recognize that various modifications and changes may be made to the present invention without strictly following the exemplary embodiments and applications illustrated and described herein. For example, the methods, devices and systems discussed herein may be implemented in connection with a variety of technologies such as those involving one or more of eye wear, television, handheld displays and the like. The invention may also be implemented using a variety of approaches such as those involving producing electrically conductive versions of translucent objects that are otherwise nonconductive.

Such modifications and changes do not depart from the true spirit and scope of the present invention, including that set forth in the following claims.

What is claimed is:

1. A method comprising:
    synthesizing silver nanowires in a solution containing a structure-directing agent that includes polyvinylpyrrolidone;
    depositing the silver nanowires on a substrate to form a sheet of nanowires; and
    heating the deposited silver nanowires to a temperature in a range of around 180 degrees Celsius and 200 degrees Celsius for 20 minutes to 60 minutes, thereby removing the structure-directing agent and modifying the electrical conductivity and optical transmittance of the sheet of nanowires.

2. The method of claim 1, wherein the step of heating results in a sheet conductivity level that is less than about 25 ohms per square and a sheet transmittance of at least about 80% for all wavelengths between about 400 nanometers and 800 nanometers.

3. The method of claim 1, wherein the step of synthesizing silver nanowires includes creating silver nanowires having an average length of about 5 µm to 20 µm and an average diameter of less than about 100 nm.

4. The method of claim 1, wherein the step of synthesizing silver nanowires includes creating silver nanowires having an average length of about 8 µm to 9 µm and an average diameter of less than of about 100 nm.

5. The method of claim 1, further including the step of depositing an organic photovoltaic cell onto the sheet of nanowires.

6. The method of claim 1, further including the step of applying, to the heated and deposited silver nanowires, pressure of about $1.4(+/-0.6) \times 10e4$ pounds per square inch for about 30 seconds.

7. The method of claim 1, further including a step of applying uni-axial pressure to the substrate to reduce surface roughness of the sheet of nanowires.

8. The method of claim 1, wherein the resistance of the sheet of nanowires is greater than 1 k$\Omega$/sq prior to heating.

9. The method of claim 1, wherein the resistance of the sheet of nanowires is approximately 100 $\Omega$/sq after the step of heating.

10. The method of claim 1, wherein the step of removing the structure-directing agent includes annealing the deposited silver nanowires at a temperature in a range of around 180 degrees Celsius and 200 degrees Celsius for 30 minutes to 40 minutes.

* * * * *